United States Patent [19]
Baier

[11] Patent Number: 5,307,374
[45] Date of Patent: Apr. 26, 1994

[54] DIGITAL RECEIVER WITH REDUCED MEMORY REQUIREMENT FOR VITERBI EQUALIZATION

[75] Inventor: Alfred Baier, Eckental, Fed. Rep. of Germany

[73] Assignee: U.S. Philips Corporation, New York, N.Y.

[21] Appl. No.: 797,871

[22] Filed: Nov. 26, 1991

[30] Foreign Application Priority Data

Nov. 30, 1990 [DE] Fed. Rep. of Germany ....... 4038251

[51] Int. Cl.$^5$ ................................................. H03H 7/30
[52] U.S. Cl. ..................................... 375/11; 371/40.1; 375/94
[58] Field of Search ......................... 375/11, 12, 14, 94, 375/39, 122, 100, 102; 371/40.1, 43, 40.4

[56] References Cited

U.S. PATENT DOCUMENTS

| | | | |
|---|---|---|---|
| 4,748,626 | 5/1988 | Wong | 375/39 |
| 4,823,346 | 4/1989 | Kobayashi et al. | 371/43 |
| 5,119,400 | 6/1992 | Koch | 375/12 |

OTHER PUBLICATIONS

IEEE Global Telecommunications Conference & Exhibition Globecom '90, Dec. 2-5, 1990, San Diego, US, vol. 3, pp. 1679-1684.

*Primary Examiner*—Stephen Chin
*Assistant Examiner*—Don N. Vo
*Attorney, Agent, or Firm*—David R. Treacy

[57] ABSTRACT

A receiver for digital information transmitted over a dispersive channel. Where the channel has a storage depth of n bits, memory requirements for an adaptive equalizer are reduced by storing transition states for only $2^{n'}$ states, where $n' < n$, and storing at least n previous bits for $2^{n'}$ states in a memory path register. At the same time the equalizer may be based on a reduced state model with $2^{n'}$ states. Only n' bits are determined directly by state transitions; the remaining n−n' bits appear from each memory path leading to the respective state, stored in the memory path register.

20 Claims, 2 Drawing Sheets 5,307,374

DIGITAL RECEIVER WITH REDUCED MEMORY REQUIREMENT FOR VITERBI EQUALIZATION

BACKGROUND OF THE INVENTION

The invention relates to a receiver for a digital transmission system comprising a transmission channel having a storage depth n with an analog signal processing section; and more particularly to such a receiver which comprises an analog-to-digital converter and an equalizer which has a digital signal processing section that includes a memory means with a register for storing state transitions.

Such receivers are necessary for the future pan-European mobile radio system (GSM system). In this mobile radio system speech signals are transmitted in digitized form together with other digital signals according to a time-division multiple-access method. These data are transmitted by a transmitter of the mobile radio system via a suitable modulation. As a result of reflections and multipath propagation on the transmit path the transmitted signal reaches the receiver in various superposed signal portions presenting different delays and phase shifts. This distorts the signal transmitted by the transmitter. These distortions cause the bits contained in the received signal to be affected by preceding bits (intersymbol interference). Between transmitter and receiver there is a transmission channel having a storage depth n, where n is an integer and denotes the number of interfering neighbouring bits. For recovering the original data content of the signal, it is necessary to equalize the received signal.

DE-A 39 11 999 to which U.S. Pat. No. 5,119,400 corresponds discloses a receiver for a digital transmission system of the type described above. The receiver comprises an equalizer for forming binary estimates on the basis of a sequence of signal sample values. Each sample value can be assigned with time to a transmitted bit having the binary "0" or "1" value and depends on this bit and also on n immediately preceding bits. The equalization is then performed with the aid of the so-called Viterbi algorithm. According to this algorithm $2^n$ states and a probability parameter for each transition from one state to a time-consecutive state are assigned to each sample value. By stringing the state transitions together, paths are formed and an overall probability parameter is formed from all the probability parameters of one path. From all the paths leading to one state only the path having the smallest overall probability is taken into consideration. A transition from a state determined by the bits $b_{i-1} \ldots b_{i-n}$ at a discrete instant i with a binary value $b_{i-n}=0$ (="0"-transition) to a next state determined by the bits $b_i \ldots b_{i-n+1}$ at an instant $i+1$ determines so-called "0"-paths; and with a binary value $b_{i-n}=1$ (="1"-transition) determines so-called "1"-paths. From the overall probability parameters of all the possible "0"-paths and from the overall probability parameters of all the possible "1"-paths, always the smallest overall probability parameter is selected. The path defined by the bit sequence $b_i, \ldots b_{i-n}$ for $b_{i-n}=0$ or $b_{i-n}=1$ respectively, and having the smallest overall probability parameter of all the $2^n$ possible "0"-paths or "1"-paths characterizes the minimum "0"-path or minimum "1"-path respectively. The binary number, i.e. zero or one, assigned to the smaller of the two selected overall probability parameters denotes the estimate, while reliability information for this estimate is formed on the basis of the two selected overall probability parameters. The reliability information is estimated in a decoder following the equalizer in the system. The costs of realizing the equalizer are in a first approximation proportional to the number of states $2^n$, i.e. they exponentially increase with the storage depth n of the transmit channel.

SUMMARY OF THE INVENTION

It is an object of the invention to provide a viterbi-equalized receiver which presents reduced manufacturing costs.

This object is achieved with a receiver of this type in that the registers of the memory means all comprise $2^{n'}$ memory locations, with $1 \leq n' < n$, and in that the memory means comprises a memory path register in which at each discrete instant at least n previous bits are stored commencing at an appropriate first previous bit for $2^{n'}$ states.

A signal received by the receiver has an analog signal behaviour as a result of the superpositioning of neighbouring bits corresponding to the storage depth n of the transmit channel. Consequently, the received signal is first sampled in the analog signal processing section. The sample values thus obtained are converted by the analog-to-digital converter and further processed by the equalizer. The equalizer of the receiver is then based on a reduced state model with $2^{n'}$ states, where $1 \leq n' < n$. With the reduced-state equalizer only n' bits are still determined directly by a state transition. The remaining $n-n'$ bits appear from each memory path leading to the respective state, which path is stored in the memory path register. This is advantageous in that only $2^{n'}$ states are to be processed at each sampling instant as against an equalizer that takes all $2^n$ states into consideration. In a coarse approximation this achieves a cost reduction by the factor of $2^n/2^{n'}$.

A low-cost estimate for a bit is formed in that the equalizer comprises a control and arithmetic logic which forms probability parameters for a state transition on the basis of the $n'+1$ bits featuring this state transition and stored in the memory means and on the basis of the $n-n'$ bits of the memory path register, which control and arithmetic logic forms a minimum "0"-path and a minimum "1"-path respectively, on the basis of the bit sequences of all the $2^{n'}$ possible "0"-paths and "1"-paths and forms appropriate overall probability parameters. The control and arithmetic logic decides the binary value assigned to the smaller of the two considered overall probability parameters to be an estimate for the bit $b_{i-n'}$; and then forms reliability information for this estimate on the basis of the two considered overall probability parameters. During this operation the control and arithmetic logic provides the whole control, the formation of the probability parameters and the overall probability parameters as well as the implementation of the equalization based on the Viterbi method as is described, for example, in U.S. Pat. No. 5,119,400.

In a preferred embodiment the memory path register has a storage depth of M previous bits, with $M \geq n$. At instant i an estimate is taken from the minimum "0"-path for the bit $b_{i-N}$ with $n' < N \leq M$ if the overall probability parameter of the minimum "0"-path is smaller than the overall probability parameter of the minimum "1"-path, and otherwise from the minimum "1"-path, while a timely assignment of the estimate of the bit $b_{i-N}$ to the reliability information of the estimate assigned to the bit $b_{i-n'}$ is obtained when delaying the reliability information by $N-n'$ time intervals. The estimates recovered from memory locations further back in time of the memory path, present a greater reliability compared with the estimates recovered from a "shorter" memory path register.

In a further embodiment the memory path register has a storage depth of M previous bits, with $M \geq n$, while at instant i reliability information is formed for the bit $b_{i-N}$ with $n' < N \leq M$ and this reliability information is substituted by a predeterminable substitute value if either only "0"-paths or "1"-paths exist at instant i. This achieves that the equalizer continues to operate with a suitable substitute value in the cases where no exact reliability information can be derived for the bit $b_{i-N}$.

In another embodiment the reliability information is formed by the ratio between the probability values of the two selected paths. The ratio between the two probability values then expresses how many times an estimate is more probable than the complement value of this estimate.

In a further embodiment the squared distance of the probability of the transition between two states is used as a metric of a probability parameter and the metric found for a state transition is added to the overall metric determined so far to form the overall metric of an overall probability parameter. Use is then made of the possibility that instead of the probability parameters, so-called metrics can be used which result from the negative logarithm of each probability parameter. This is advantageous in that the metrics only need to be added together to calculate an overall probability, whereas the individual probability parameters are to be multiplied.

In an embodiment the overall metric of the "0"-paths is subtracted from the overall metric of the "1"-paths, the sign of the difference denoting the estimate and the absolute difference value denoting the reliability information assigned to the estimate. A positive sign then indicates that "1" is more probable as an estimate than "0".

In an embodiment the reliability information is corrected by a value depending on a determined noise power. With the reliability information thus weighted, it will then be possible to use for the further processing of the received signal the very data elements of the received signal that form an optimum security against an erroneous estimate.

In an embodiment the information signals to be transmitted are encoded into bits by means of a convolutional encoder at the transmitter end while at the receiver end a convolutional decoder is arranged as a decoder after the equalizer, which decoder, when decoding, processes not only the estimated bits, but also the reliability information assigned to these estimated bits. In this manner the probability is enhanced that also the actually transmitted data sequence is obtained after decoding, because the decoder also comprises the information as to which individual bits it may "trust" more and which bits it may "trust" less.

In the following the invention will be further explained with reference to the exemplary embodiments shown in the drawing.

DESCRIPTION OF THE PREFERRED EMBODIMENTS

Figure 1:
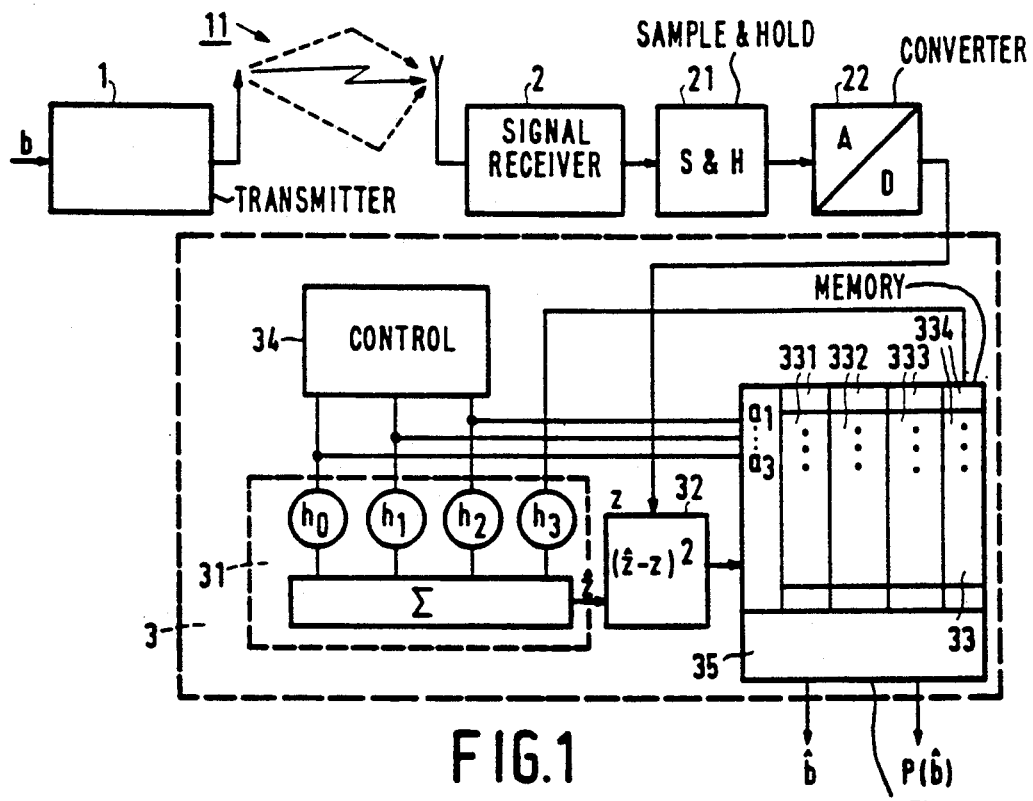
FIG. 1 shows a block diagram of a digital transmission system.

FIG. 1 shows a radio transmission system in which the information signals to be transmitted are radiated in the form of a binary signal b over a transmitter 1. Between the transmitter 1 and a receiver formed by a signal receiver 2, a sample-and-hold element 21, an analog-to-digital converter 22 and an equalizer 3, a transmission channel 11 is arranged as a radio link denoted by an arrow. The receiver 2 is followed in the system by a sample-and-hold element 21 as well as an analog-to-digital converter 22. The signals at the digital output of the analog-to-digital converter 22 are applied to the equalizer 3. The equalizer 3 comprises a digital signal processing section that includes a signal estimator 32, a control circuit 34, a transversal filter 31, a memory means 33 also referenced memory module in the following, as well as a control and arithmetic logic 35. The memory means 33 comprises registers 331, 332, 333 as well as a memory path register 334. The control and arithmetic logic 35 generates an estimate $\hat{b}$ as well as reliability information ($P\hat{b}$) for this estimate $\hat{b}$.

The transmitted signal is distorted on the radio link situated between the transmitter 1 and the receiver 2 as the result of multipath propagation due to reflections and due to superimposed noise and further disturbing signals, as is shown in FIG. 1 by the dashed arrows of the radio link. Consequently, a bit $b_i$ of the binary signal b transmitted at a discrete instant i is superimposed by delayed signal portions of previously transmitted bits $b_{i-1}, b_{i-2}, \ldots$. This superpositioning corresponds to a signal distortion. Consequently, the signal received for a transmitted bit can no longer be unequivocally assigned to a low or high level. The transmission channel 11 has thus a storage depth n, where n is the number of interfering neighbouring bits. The storage depth n can also be defined as a quotient of the channel impulse response length of the transmit channel 11 and a bit duration of the received signal, minus 1, while the largest integer from this result is to be taken. As a result of these superpositionings the signal received from receiver 2 has an analog signal variation which cannot be assigned to the originally transmitted bit without equalization. The signal received from the receiver 2 is first sampled by the sample-and-hold element 21 at equidistant instants. The analog sample values thus obtained are converted into digital sample values z to be further processed by the analog-to-digital converter 22.

The influence of already transmitted bits depends on the delay of the signal portions arriving at the receiver. After a specific period of time depending on the characteristic feature of the transmission channel, the influence is no longer essential and therefore need not be taken into consideration for an equalization. As a rule, the delay is expressed as a number of bits transmitted in this period of time. For the equalizer 3 it holds that each sample value $z_i$ that can be assigned to a bit $b_i$ transmitted at an instant i depends on the bit $b_i$ that can be assigned to this sample value and on n bits $b_{i-1}, b_{i-2}, \ldots, b_{i-n}$ that have preceded this bit.

The equalization of the signal z of the output of the analog-to-digital converter 22 is based on a channel model approximately describing the dispersive transmission channel 11 of the radio transmission system by means of a linear finite transversal filter. For such a channel model the transmission properties of the transmit channel are simulated by means of filter coefficients $h_0 \ldots h_n$. At the receiver end efforts are therefore made with this specific channel model to simulate the distortions occurring on the transmission path by means of the transversal filter 31, which distortions are caused by the linear combinations comprising a memory. The simulation of the transmission path is attained by accordingly adjusting the filter coefficients $h_0, \ldots, h_3$, for $n=3$. The filter coefficients $h_0, \ldots, h_3$ may then be derived from the sample values of an estimated impulse response of the transmission channel. For example, a so-called training sequence may therefore be used, which comprises a bit sequence known to both the transmitter 1 and the receiver 2. With each reception of the training sequence the filter coefficients $h_0, \ldots, h_3$ are adjusted so that after the transversal filter 31 has been passed through the transmission channel having the fewest errors is simulated. This is known, for example, from DE 40 01 592 A1.

In the exemplary embodiment represented in FIG. 1 the circuit arrangement for forming the filter coefficients is not shown for clarity. The equalizer shown in FIG. 1 is based on the so-called Viterbi method as described, for example, in European Patent Application EP 0 294 116 A2. The Viterbi method as such is known, for example, from the paper entitled "The Viterbi algorithm" by G. David Forney Jr., Proceedings of the IEEE, Vol. 61, No. 3, March 1973. According to this algorithm a so-called soft decision decoding for the data elements to be decoded of an encoded data sequence requires reliability information for the data sequence to be decoded. The reliability information is a probability parameter denoting with what probability the data elements to be decoded correspond to the transmitted data elements. As a rule, a state diagram is used for representing the Viterbi method, as is done in the FIGS. 2 to 4. Instead of probability parameters also so-called metrics may be used, while the metric can be calculated from the negative logarithm of each probability parameter. This is advantageous, for example, in that the metrics now only need to be added together for calculating an overall probability, whereas the individual probability parameters are to be multiplied.

For calculating the transition probability from one state to a next state, the individual binary values of the bits $b_i, \ldots, b_{i-n}$ of a state are used as input parameters of the transversal filter 31. The output value of the transversal filter 31 produces as a first approximate, while discarding disturbances caused by a disturbing or noise signal etc. contained in the input signal, the value which the sample should adopt when the bit sequence $b_i, \ldots, b_{i-n}$ used as an input parameter is transmitted or received over the radio link. By comparing the output value of the transversal filter 31 with the actual sample value, the most probably transmitted bit sequence may thus be found.

A large transition probability from one state to a next state does not yet provide sufficient guarantee for the correctness of this transition, because a state transition that has actually not taken place may accidentally appear as the most probable transition due to brief disturbances or signal noise. More correct estimates of the state transitions are achieved by taking the whole signal variation produced so far into consideration by means of a probability examination of all the state transitions leading to one of the $2^n$ states at the instant concerned. The costs of realising such an equalizer are approximately proportional to the number of states $2^n$, i.e. they rise exponentially with the storage depth n of the transmit channel.

Alternatively, the equalizer 3 shown in FIG. 1 is based on a state model with $2^{n'}$ states, where $1 < n' < n$. In the exemplary embodiment shown in FIG. 1, $n=3$ and $n'=2$. This produces a reduction of the number of states $2^{n'}=4$ as against the equalizer having the full number of states $2^n=8$. The difference from the equalizer with a full number of state $2^n$ consists of the fact that in the equalizer with a reduced number of states $2^{n'}$ only the n' bits $b_i, \ldots, b_{i-n'}$ are determined direct by a state transition $S_{i'}$, $S_{i'+1}$. The remaining $n-n'$ bits $b_{i-n'-1}, \ldots, b_{i-n}$ emerge from a memory path leading to the state $S_{i'}$, which is stored in a memory path register 334 of the memory module 33. Therefore, in contradistinction to the soft decision equalizer with a full number of states, the memory path register 334 is to be used for the soft decision equalizer with a reduced number of states. In this register 334 at least n previous bits $b_{i-1}, \ldots, b_{i-n}, b_{i-n'-1}, \ldots, b_{i-n'} \ldots$ are to be stored at each instant i from the bit $b_{i-1}$ for all $2^{n'}$ states $S_{i'}$. The bits $b_{i-1}, \ldots, b_{i-n'}$ need not necessarily be stored in the memory path register 334 because they are identical with the state bits of the state $S_{i'}$ concerned.

For forming the metric in the exemplary embodiment shown in FIG. 1 an output value $\hat{z}_i$ of the transversal filter 31 is subtracted from the digital sample value $z_i$ in a signal estimator 32 and squared. In this manner a squared distance is formed. The probability that the received sample value has originated from the bit sequence used as an input parameter is greater as this squared distance is smaller. Due to the linear combination of the n last digits, however, an optimum estimate cannot be formed until all n bits have been received.

The estimate $\hat{b}_i$ assigned to the sample value $z_i$ is assigned in time to the state transitions from one state $S_{i'}$ to the states $S_{i+1'}$ at the instant $i+1$.

For implementing the method, the memory module 33 shown in the exemplary embodiment represented in FIG. 1 comprises metric registers denoted 331, 332, 333 as well as the memory path register 334. Each register comprises $2^{n'}$ memory locations, the three bits $a_1 \ldots a_3$ being used for addressing the columns as will be described hereinbelow. Each memory location of the registers is then assigned a single address $a_1 \ldots a_3$. The overall metric assigned to one state is stored in the first register 331. In the second metric register 332 a new overall metric is stored at the address $a_1 \ldots a_3$, which metric has been produced by a "0" transition, i.e. so-called "0"-paths, whereas in the third register 333 an overall metric is stored produced by a "1"-transition, i.e. so-called "1"-paths. With a state transition from a state $S_{i'}$ determined by the bits $b_{i-1}, \ldots, b_{i-n}$ at an instant i with a bit $b_{i-n'}=0$ (="0"-transition) to a next state $S_{i+1}$ determined by the bits $b_i \ldots b_{i-n'+1}$ at an instant $i+1$, so-called "0"-paths are determined and, similarly, so-called "1"-paths with a digit $b_{i-n}=1$ (="1"-transition). Furthermore, at least n previous bits are stored in the memory path register 334 for all $2^{n'}$, i.e. four, states in the exemplary embodiment shown in FIG. 1. When a memory location is driven the control circuit 34 simultaneously applies the relevant address $a_1, \ldots, a_3$ to the transversal filter 31 as an input parameter. For each formed address the first input parameter is available at the control circuit as a first binary number, for example, a "0". From this value $\hat{z}$ of the transversal filter 31 thus obtained and the sample value z the squared distance $(\hat{z}-z)^2$ is formed in the estimator 32. From this squared distance and from the overall metric stored in the first metric register 331 at the appropriate address a new overall metric is formed which is stored in the second metric register 332 at the appropriate address. In similar fashion the second binary number, for example, a "1" is available for the first input parameter and the overall metric obtained in this fashion is stored in the third metric register 333. Once the control circuit 34 has passed through all the address combinations, and all the contents of the second and third path registers 332, 333 have been calculated once again, the smallest values are selected from all the new overall metrics of the second and third metric registers 332, 333. These two values are subtracted from each other. The sign of the difference finally denotes the estimate $\hat{b}$ and the absolute difference value the desired reliability information $P(\hat{b})$ for the bit $b_{i-n'}$. Once the estimate $\hat{b}$ has been determined, an update takes place, i.e. the relocation of the first to third path registers 331, . . . , 333 and of the metrics stored in the memory path register 334.

For this operation the control and arithmetic logic 35 also denoted equalizer logic provides the overall control, the formation of the overall metrics as well as the implementation of the Viterbi algorithm. This is effected in a fashion known, for example, from DE-A 39 11 999. Subsequently, the arrival of a new sample value is awaited and the associated new estimate and the associated reliability information is formed in the manner already described.

Thus, the following steps are executed with the exemplary embodiment shown in FIG. 1:
1. Fetch $L_i(b_{i-1}, \ldots, b_{i-n'})=L_i(S_{i'})$ from register 331
2. Fetch $(b_{i-n'-1}, \ldots, b_{i-n})$ from register 334 for the path $(b_{i-1}, \ldots, b_{i-n'})$
3. $L_{i+1}(S_{i'}, S_{i+1'})=L_{i+1}(b_i, b_{i-1}, \ldots, b_{i-n'})=L_i(S_{i'})+|\hat{z}_i-z_i|^2$, where $$\hat{z}_i = \sum_{v=0}^{n} y_{i-v} \times h_v$$

with $y_{i-\nu}(+1, -1)$
4. If $b_{i-n'}=0$, store $L_{i+1}(S_{i'}, S_{i+1'})$ in register 332 at the address $(b_i, b_{i-1}, \ldots, b_{i-n'+1})$
5. If $b_{i-n'}=1$, store $L_{i+1}(S_{i'}, S_{i+1'})$ in register 333 at the address $(b_i, b_{i-1}, \ldots, b_{i-n'+1})$
6. Search for minimum of the "0"-paths $L_{i+1}$ from register 332
7. Search for minimum of the "1"-metrics $L_{i+1}$ from register 333
8. Determine $P(\hat{b}_{i-n'})$ and $\hat{b}_{i-n'}$ from minimums (6. and 7.)
9. Update registers 331 and 334.

Here L denotes the overall metrics of the paths characterized by the individual state transitions.

Figure 2:
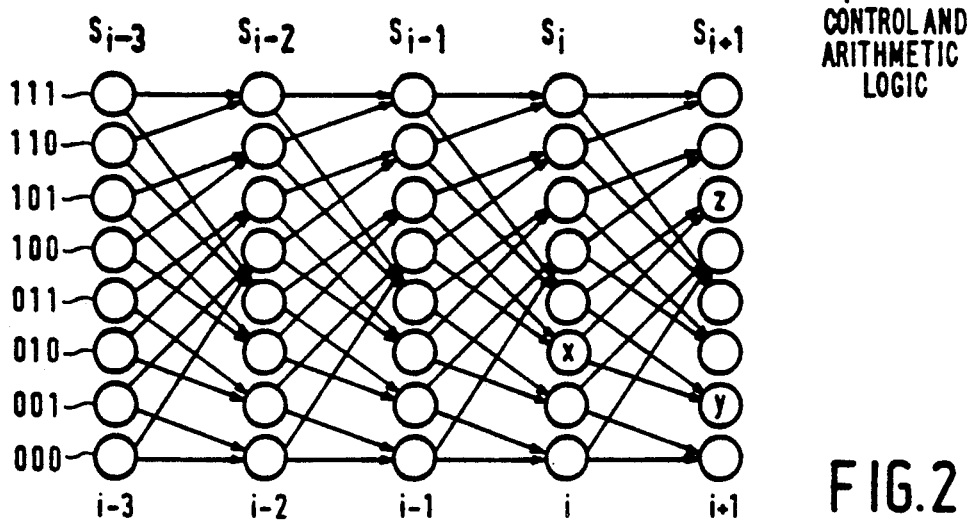
FIGS. 2 to 5 show state diagrams for an equalizer.

The state diagram shown in FIG. 2 is a diagram having columns of $2^n$ nodes. Each node represents one of the combinations that can be produced from n bits. Each column is assigned to a specific sampling instant $i-3, i-2, i-1, i, i+1$. The individual binary values 000 . . . 111 that can be assigned to a node are denoted states. A state always corresponds to the fact that the n last digital sample values received at an instant i may have been assigned to a bit sequence that may have been transmitted. When a new sample value is received both the "0" bit and the "1" bit may be assigned to it. A bit sequence 010 results in a bit sequence 0010 when the most recent sample value is assigned to the binary value 0. Since the oldest sample value does not affect the equalization because a new sample value is received, this new binary value is omitted. In the state diagram shown in FIG. 2 all the possible transitions are denoted by arrows. For example, the node x features a state of the bit sequence 010 at instant i. Via a 0 the node y is arrived at, to which the state $S_{i+1}=001$ is assigned at the instant i+1; via a "1"-transition, node z is arrived at, to which the state $S_i=101$ is assigned at the instant i+1. A path is formed by stringing related transitions together. This path has the same meaning as the reconstructed bit sequence $b_i, \ldots, b_{i-n}$. The state diagram shown in FIG. 2 based on the prior-art state model from DE-A 39 11 999 clarifies that the manufacturing costs for an equalization based on a number of states $2^n$ are high.

Figure 3:
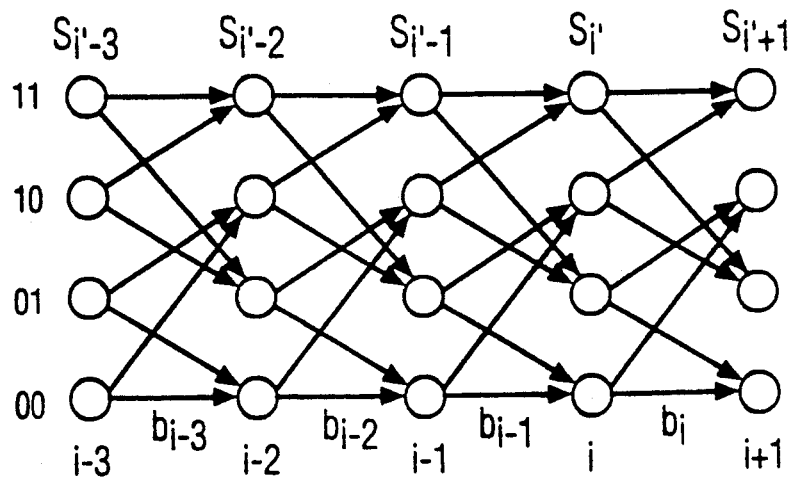

FIG. 3 shows a state diagram for the equalizer shown in FIG. 1, which diagram is based on a state model with only $2^{n'}$ states, with $2^{n'}=4$. If the state diagram represented in FIG. 2 is compared with the state diagram represented in FIG. 3, the saving on manufacturing costs relative to a state model with $2^n$ states will become apparent. Furthermore, in the state diagram represented in FIG. 3 (state trellis) all the possible paths are featured. Generally, so-called "0"-paths are determined by a state transition from a state $S_{i'}$ determined by the bits $b_{i-1} \ldots b_{i-n'}$ at an instant i having a bit $b_{i-n'}=0$ (="0"-transition) to a time-consecutive state $S_{i+1'}$ determined by the bits $b_i \ldots b_{i-n'+1}$ at an instant i+1, and, similarly, so-called "1"-paths with a bit $b_{i-n'}=1$ (="1"-transition). In the state trellis represented in FIG. 3 $n'=2$ was used in accordance with the examples already used for the description of FIG. 1. Thus, in the state trellis represented in FIG. 3 the state transition $S_{i'}$, $S_{i+1'}$ is characterized by the bits $b_i, b_{i-1}, b_{i-2}$. The bit $b_{i-3}$ characterizing the state $S_{i+1'}$ may be fetched from the memory path register at the instant i from the location i−3.

Figure 4:
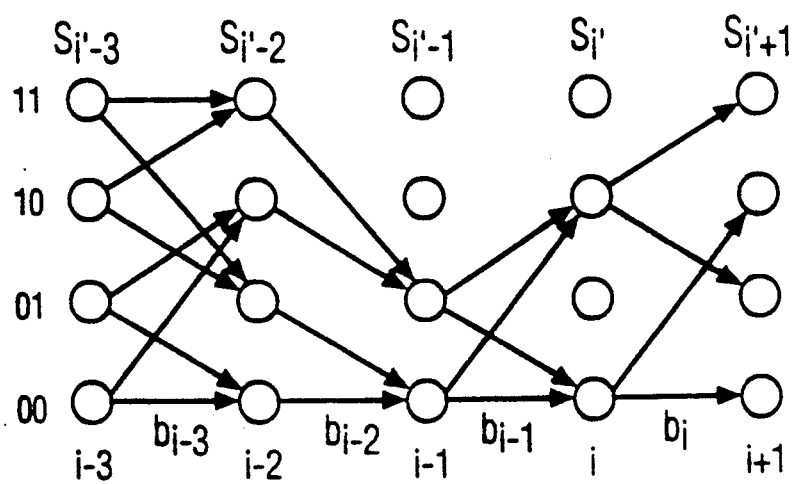

FIG. 4 shows a state diagram in which only the paths are shown for which all transitions from the instant i−2 to the instant i−1 were "0"-transitions, i.e. for which always the binary number "0" was assigned to the bit $b_{i-2}$. This corresponds to the "0"-paths for a state transition $S_{i'}, S_{i+1'}$. For the values of the exemplary embodiment of $n=3$, $n'=2$ the probability parameters are computed on the basis of $2^{n'}=4$ states 11, 10, 01, 00. Only the $n'+1=3$ bits $b_i, b_{i-1}, b_{i-2}$ are then determined direct by the state transition $S_{i'}, S_{i+1'}$, whereas the remaining $n-n'=1$ bit $b_{i-3}$ results from the memory path leading to the state $S_{i'}$. For this reason, in contradistinction to the so-called soft decision equalizer with a full number of states, a memory path register which stores at each state i for all $2^{n'}$ states the memory path $b_{i-1}, \ldots, b_{i-n'}, b_{i-n'-1}, \ldots, b_{i-n}, \ldots$ over a length of at least n bits reckoned from the bit $b_{i-1}$ is explicitly to be updated. The bits $b_{i-1}, \ldots, b_{i-n}$ may also be omitted for this purpose because they are actually identical with the bits of the state $S_{i'}$ concerned.

Figure 5:
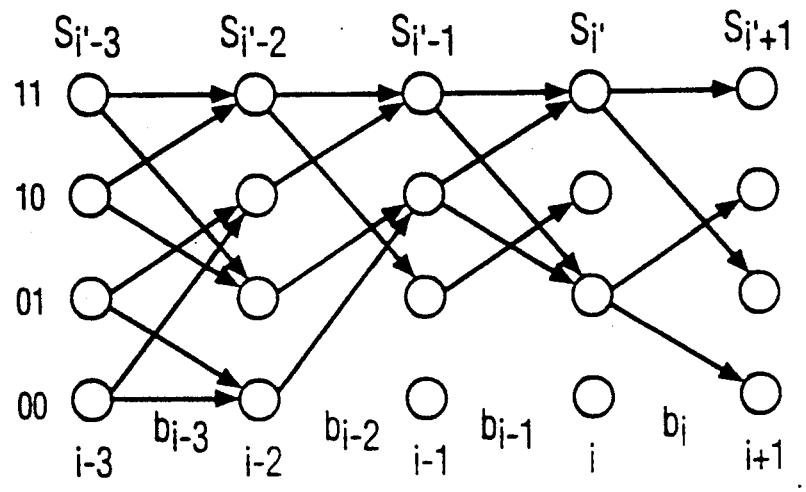

FIG. 5 shows a state trellis in which only all the "1"-paths for a state transition $S_{i'}, S_{i+1'}$ are shown. Here the binary number "1" is assigned to each bit $b_{i-2}$. For forming the estimate and the reliability information the smallest overall metric is determined from all the overall metrics of the states resulting from a "0"-transition and from all the overall metrics resulting from a "1"-transition, i.e. the path having the smallest overall metric is selected from the state diagrams shown in FIGS. 4 and 5. These paths then form the minimum "0" or minimum "1"-path respectively. Each of the two selected minimum overall metrics expresses the probability with which each selected path in the ideal case can be assigned to the estimate $b_{i-n'}=0$ or the estimate $b_{i-n'}=1$. These probability values can be computed from the overall metrics. In the last step the two overall probability parameters available for each state $S_{i+1}$ are compared with each other and the smaller overall probability parameter is assigned to each state $S_{i+1}$ as the new probability parameter. By means of inverse metrics it is also possible to form maximums instead of minimums.

Figure 6:
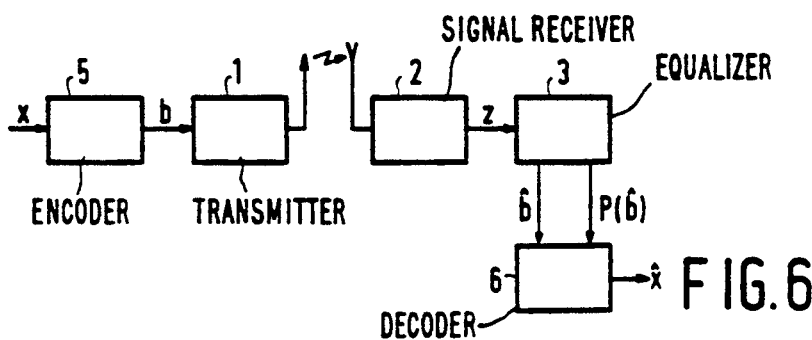
FIG. 6 shows a further exemplary embodiment for a digital transmission system.

FIG. 6 shows a further exemplary embodiment of a digital transmission system. An information signal x to be transmitted is first applied to a convolution encoder 5. The convolution encoder 5 produces a binary signal b which is transmitted over a dispersive transmit channel by a transmitter 1. At the receiver end there is receiver 2 which produces a sample signal z. This sample signal z is applied to an equalizer 3. The equalizer produces estimates $\hat{b}$ as well as appropriate reliability information $P(\hat{b})$. The estimates as well as the reliability information are applied to a decoder 6 which decodes herefrom a sequence of $\hat{x}$. A decoder operating according to the Viterbi process is used for this decoding.

For the Viterbi decoding the received encoded signal sequence is compared with any valid code sequence the encoder 5 might have produced. For the Viterbi decoder the number of bits are used in which the equalized data sequence is distinguished from the individual code elements of the code storage. When multiplying a metric obtained in this fashion by the reliability information an estimate is obtained of a data sequence to be decoded. In this fashion the probability is enhanced that the originally transmitted data sequence is really obtained after decoding. The decoder 6 then uses not only the signal redundance for decoding purposes but also information about which individual bits of the data sequence to be decoded it may "trust" more or "trust" less.

I claim:

1. A receiver for a digital transmission system using a dispersive transmission channel, wherein the transmission channel has a storage depth of n bits, where n is an integer, said receiver comprising:
    means for receiving signals digitally transmitted over said channel, having an analog output,
    an analog-to-digital converter receiving said analog output, and having a digitized output, and
    an equalizer receiving said digitized output, including a memory having at least one register for storing state transitions and control means for forming estimates of received bits based at least partly on said digitized output and said state transitions,
    characterized in that said memory comprises $2^{n'}$ memory locations only for storing state transitions, where $1 \leq n' < n$ and n' is an integer, and a memory path register for storing at each discrete instant (i) at least n previous bits $(b_{i-1}, \ldots, b_{i-n'}, b_{i-n'-1}, \ldots, b_{i-n}, \ldots)$ commencing at a first previous bit $(b_{i-1})$ for $2^{n'}$ states.

2. A receiver as claimed in claim 1, characterized in that said memory path register has a storage capacity of M previous bits, where $M \geq n$ and M is an integer, and said control means comprises:
    means for determining a minimum "0"-path and a minimum "1"-path respectively, based on the bit sequences $(b_i, b_{i-1}, \ldots, b_{i-n'+1}, b_{i-n'})$ of all the $2^{n'}$ possible "0"-paths and "1"-paths,
    means for determining overall probability parameters for said minimum "0"- and "1"-paths, and for forming at one said instant i an estimate for the bit $(b_{i-N})$, where $n' < N < M$ and N is an integer, and
    means for providing a reliability parameter for an estimate for bit $(b_{i-n'})$, based on said overall probability parameters for said minimum "0"- and "1"-paths, after $N-n'$ time intervals.

3. A receiver as claimed in claim 2, characterized in that said control means comprises means for forming reliability information for the bit $(b_{i-N})$ at said one said instant i, and substituting for said reliability information a predetermined substitute value if either only "0"-paths with $b_{i-N}=0$ or only "1"-paths with $b_{i-N}=1$ exist at said one said instant i.

4. A receiver as claimed in claim 3, characterized in that said reliability information is formed by a ratio between the probability values of two selected paths.

5. A receiver as claimed in claim 1, characterized in that said memory path register has a storage capacity of M previous bits, where M is an integer, and said control means comprises:
    means for determining a minimum "0"-path and a minimum "1"-path respectively, based on the bit sequences $(b_i, b_{i-1}, \ldots, b_{i-n'+1}, b_{i-n'})$ of all the $2^{n'}$ possible "0"-paths and "1"-paths, and
    means for forming reliability information for the bit $(b_{i-N})$ at one said instant i, where $n' < N < M$ and N is an integer, and substituting for said reliability information a predetermined substitute value if either only "0"-paths with $b_{i-N}=0$ or only "1"-paths with $b_{i-N}=1$ exist at said one said instant i.

6. A receiver as claimed in claim 5, characterized in that said reliability information is formed by a ratio between the probability values of two selected paths.

7. A receiver as claimed in claim 1, characterized in that said control means comprises means for forming reliability information based on a ratio between the probability values of two selected paths of state transitions.

8. A receiver as claimed in claim 7, further comprising means for determining noise power, characterized in that said control means further comprises means for correcting said reliability information by a value dependent on the determined noise power.

9. A receiver as claimed in claim 1, characterized in that said control means comprises:
    means for squaring a difference of the probability of transition between two states, the squared difference being a metric of a probability parameter, and
    means for adding said metric to a previously determined overall metric to form a new overall metric of an overall probability parameter.

10. A receiver as claimed in claim 1, characterized in that control means comprises:
    means for determining a minimum "0"-path and a minimum "1"-path respectively, based on the bit sequences $(b_i, b_{i-1}, \ldots, b_{i-n'+1}, b_{i-n'})$ of all the $2^{n'}$ possible "0"-paths and "1"-paths, and
    means for subtracting the overall metric of the minimum "0"-path from the overall metric of the minimum "1"-path to form a difference, said estimates being based on the sign of said difference, and the absolute value of said difference forming reliability information assigned to said estimates.

11. A receiver as claimed in claim 1, wherein said signals have been encoded into bits (b) from information signals (x) by a convolution encoder prior to transmission, characterized in that said receiver further comprises a convolution decoder arranged after said equalizer, said decoder processing the estimated bits and reliability information assigned to estimated bits.

12. A receiver for a digital transmission system using a dispersive transmission channel, wherein the transmission channel has a storage depth of n bits, where n is an integer, said receiver comprising:
    means for receiving signals digitally transmitted over said channel, having an analog output,
    an analog-to-digital converter receiving said analog output, and having a digitized output, and
    an equalizer receiving said digitized output, including a memory having at least one register for storing state transitions and control means for forming estimates of received bits based at least partly on said digitized output and probability parameters for said state transitions,
    characterized in that said memory comprises $2^{n'}$ memory locations only for storing state transitions, where $1 \leq n' < n$ and n' is an integer, and a memory path register for storing at each discrete instant (i) at least n previous bits $(b_{i-1}, \ldots, b_{i-n'}, b_{i-n'-1}, \ldots, b_{i-n}, \ldots)$ commencing at a first previous bit $(b_{i-1})$ for $2^{n'}$ states, and
    said control means comprises:
    first means for forming probability parameters for a state transition $(S_i, S_{i+1})$ based on $n'+1$ bits $(b_i, \ldots b_{i-n'})$ featuring this state transition and stored in said memory, and based on $n-n'$ bits $(b_{i-n'-1}, \ldots, b_{i-n})$ stored in said memory path register,
    second means for determining a minimum "0"-path and a minimum "1"-path respectively, based on the bit sequences $(b_i, b_{i-1}, \ldots, b_{i-n'+1}, b_{i-n'})$ of all the $2^{n'}$ possible "0"-paths and "1"-paths,
    third means for determining overall probability parameters for said minimum "0"- and "1"-paths, and selecting the binary value corresponding to the path having the smaller overall probability parameter to form an estimate for the bit $b_{i-n}$, and
    fourth means for providing a reliability parameter for said estimate based on said overall probability parameters for said minimum "0"- and "1"-paths.

13. A receiver as claimed in claim 12, characterized in that said memory path register has a storage capacity of M previous bits, where $M \leq n$ and M is an integer, and,
    said third means selects the binary value corresponding to the path having the smaller overall probability parameter to form an estimate for the bit $(b_{i-N})$, where $n' < N < M$ and N is an integer, at one said instant i, and
    said fourth means provides a reliability parameter for an estimate for bit $(b_{i-n'})$, based on said overall probability parameters for said minimum "0"- and "1"-paths, after $N - n'$ time intervals.

14. A receiver as claimed in claim 13, characterized in that said fourth means comprises means for forming reliability information for the bit $(b_{i-N})$ at said one said instant i, and substituting for said reliability information a predetermined substitute value if either only "0"-paths with $b_{i-N}=0$ or only "1"-paths with $b_{i-N}=1$ exist at said instant i.

15. A receiver as claimed in claim 14, characterized in that said reliability information is formed by a ratio between the probability values of two selected paths.

16. A receiver as claimed in claim 12, characterized in that said memory path register has a storage capacity of M previous bits, where $M \geq n$ and M is an integer, and said fourth means comprises means for forming reliability information for the bit $(b_{i-N})$ at one said instant i, and substituting for said reliability information a predetermined substitute value if either only "0"-paths with $b_{i-N}=0$ or only "1"-paths with $b_{i-N}=1$ exist at said one said instant i.

17. A receiver as claimed in claim 12, characterized in that said first means comprises means for squaring a difference of the probability of transition between two states, the squared difference being a metric of a probability parameter, and means for adding said metric to a previously determined overall metric to form a new overall metric of an overall probability parameter.

18. A receiver as claimed in claim 12, characterized in that fourth means comprises means for subtracting the overall metric of the minimum "0"-path from the overall metric of the minimum "1"-path to form a difference, said estimates being based on the sign of said difference, and the absolute value of said difference forming reliability information assigned to said estimates.

19. A receiver as claimed in claim 12, further comprising means for determining noise power, characterized in that said fourth means comprises means for correcting said reliability information by a value dependent on the determined noise power.

20. A receiver as claimed in claim 12, wherein said signals have been encoded into bits (b) from information signals (x) by a convolution encoder prior to transmission, characterized in that said receiver further comprises a convolution decoder arranged after said equalizer, said decoder processing the estimated bits and reliability information assigned to estimated bits.

* * * * *